(12) United States Patent
Li et al.

(10) Patent No.: US 7,096,447 B1
(45) Date of Patent: Aug. 22, 2006

(54) METHOD AND APPARATUS FOR EFFICIENTLY LOCATING AND AUTOMATICALLY CORRECTING CERTAIN VIOLATIONS IN A COMPLEX EXISTING CIRCUIT LAYOUT

(75) Inventors: Mu-Jing Li, Sunnyvale, CA (US); Suryanarayana R. Maturi, San Jose, CA (US); Pankaj Dixit, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 342 days.

(21) Appl. No.: 10/686,471

(22) Filed: Oct. 15, 2003

(51) Int. Cl.
*G06F 17/50* (2006.01)

(52) U.S. Cl. .................. 716/11; 716/2; 716/18

(58) Field of Classification Search ............ 716/1, 716/2, 11, 12, 19, 22, 18
See application file for complete search history.

(56) References Cited

U.S. PATENT DOCUMENTS

| | | | |
|---|---|---|---|
| 5,620,916 A | 4/1997 | Eden et al. | |
| 5,689,435 A | 11/1997 | Umney et al. | |
| 5,706,295 A | 1/1998 | Suzuki | |
| 5,798,937 A | 8/1998 | Bracha et al. | |
| 5,926,723 A | 7/1999 | Wang | |
| 5,970,238 A | 10/1999 | Shibata et al. | |
| 6,011,911 A | 1/2000 | Ho et al. | |
| 6,026,224 A | 2/2000 | Darden et al. | |
| 6,063,132 A | 5/2000 | DeCamp et al. | |
| 6,078,737 A | 6/2000 | Suzuki | |
| 6,189,136 B1 | 2/2001 | Bothra | |
| 6,209,123 B1 | 3/2001 | Maziasz et al. | |
| 6,275,971 B1 | 8/2001 | Levy et al. | |
| 6,301,686 B1 | 10/2001 | Kikuchi et al. | |
| 6,324,673 B1 | 11/2001 | Luo et al. | |
| 6,370,679 B1 | 4/2002 | Chang et al. | |
| 6,374,395 B1 | 4/2002 | Wang | |
| 6,378,110 B1 | 4/2002 | Ho | |
| 6,446,873 B1 | 9/2002 | Geryk | |
| 6,457,163 B1 | 9/2002 | Yang | |
| 6,461,877 B1 | 10/2002 | Holloway et al. | |
| 6,484,302 B1 | 11/2002 | Freymuth | |
| 6,487,706 B1 | 11/2002 | Barkley et al. | |
| 6,536,023 B1 | 3/2003 | Mohan et al. | |
| 6,606,735 B1 | 8/2003 | Richardson et al. | |
| 6,611,946 B1 | 8/2003 | Richardson et al. | |
| 6,615,400 B1 | 9/2003 | Lukanc | |
| 6,637,013 B1 | 10/2003 | Li | |
| 6,718,527 B1 | 4/2004 | Li | |
| 6,748,579 B1* | 6/2004 | Dillon et al. | 716/19 |

(Continued)

OTHER PUBLICATIONS

Yu Chen et al., "Hierarchical Dummy Fill for Process Uniformity," Proc. Asia and South Pacific Design Automation Conf, Jan. 2001, pp. 139-144.

(Continued)

*Primary Examiner*—Thuan Do
(74) *Attorney, Agent, or Firm*—Zagorin O'Brien Graham LLP

(57) ABSTRACT

An exemplary CAD design flow modifies an existing large scale chip layout to reinforce the redundant via design rules to improve the yield and reliability. The flow operates on each metal-via pair from bottom up to locate and correct isolated via rule violations by adding metal features and vias in a respective patch cell associated with each cluster cell. A large complex design is thus divided into cells so that multiple processes can work concurrently as if every process were working on the top level of the design layout.

43 Claims, 3 Drawing Sheets

U.S. PATENT DOCUMENTS

| | | | |
|---|---|---|---|
| 6,804,808 B1 * | 10/2004 | Li et al. ........................ 716/5 |
| 2002/0127479 A1 | 9/2002 | Pierrat |
| 2002/0174413 A1 | 11/2002 | Tanaka |
| 2003/0061583 A1 | 3/2003 | Malhotra |
| 2003/0088843 A1 | 5/2003 | Mehrotra et al. |
| 2003/0182644 A1 | 9/2003 | Li et al. |
| 2003/0196180 A1 | 10/2003 | Li et al. |
| 2003/0229860 A1 | 12/2003 | Li |
| 2003/0229862 A1 * | 12/2003 | Li et al. ........................ 716/1 |
| 2004/0019862 A1 | 1/2004 | Li et al. |
| 2004/0019866 A1 | 1/2004 | Li |
| 2004/0019867 A1 | 1/2004 | Li |
| 2004/0019868 A1 | 1/2004 | Li |
| 2004/0025125 A1 | 2/2004 | Li |
| 2004/0063228 A1 | 4/2004 | Li et al. |
| 2004/0064795 A1 | 4/2004 | Li et al. |
| 2004/0064796 A1 | 4/2004 | Li |
| 2004/0064797 A1 | 4/2004 | Li |

OTHER PUBLICATIONS

Andrew B. Kahng et al., "Filling Algorithms and Analyses for Layout Density Control," IEEE Trans. Computer Aided Design 18(4) (1999) pp. 445-462.

Barnes, "Skill: A CAD System Extension Language," 1990 27th ACM/EEE Design Automation Conference, pp. 266-271.

Karam et al., "High Level CAD Melds Microsystems with Foundries," 1996 European Design and Test Conference, pp. 442-447.

Luo et al., "An Edge-Endpoint-Based Configurable Hardware Architecture for VLSI CAD Layout Design Rule Checking," 1999 7th Annual IEEE Symposium on Field-Programmable Custom Computing Machines, pp. 158-167.

DIVA Verification, http://www.cadence.com/datasheets/diva.html 2002 Cadence Design Systems, Inc., downloaded May 17, 2002, 3 pages.

* cited by examiner

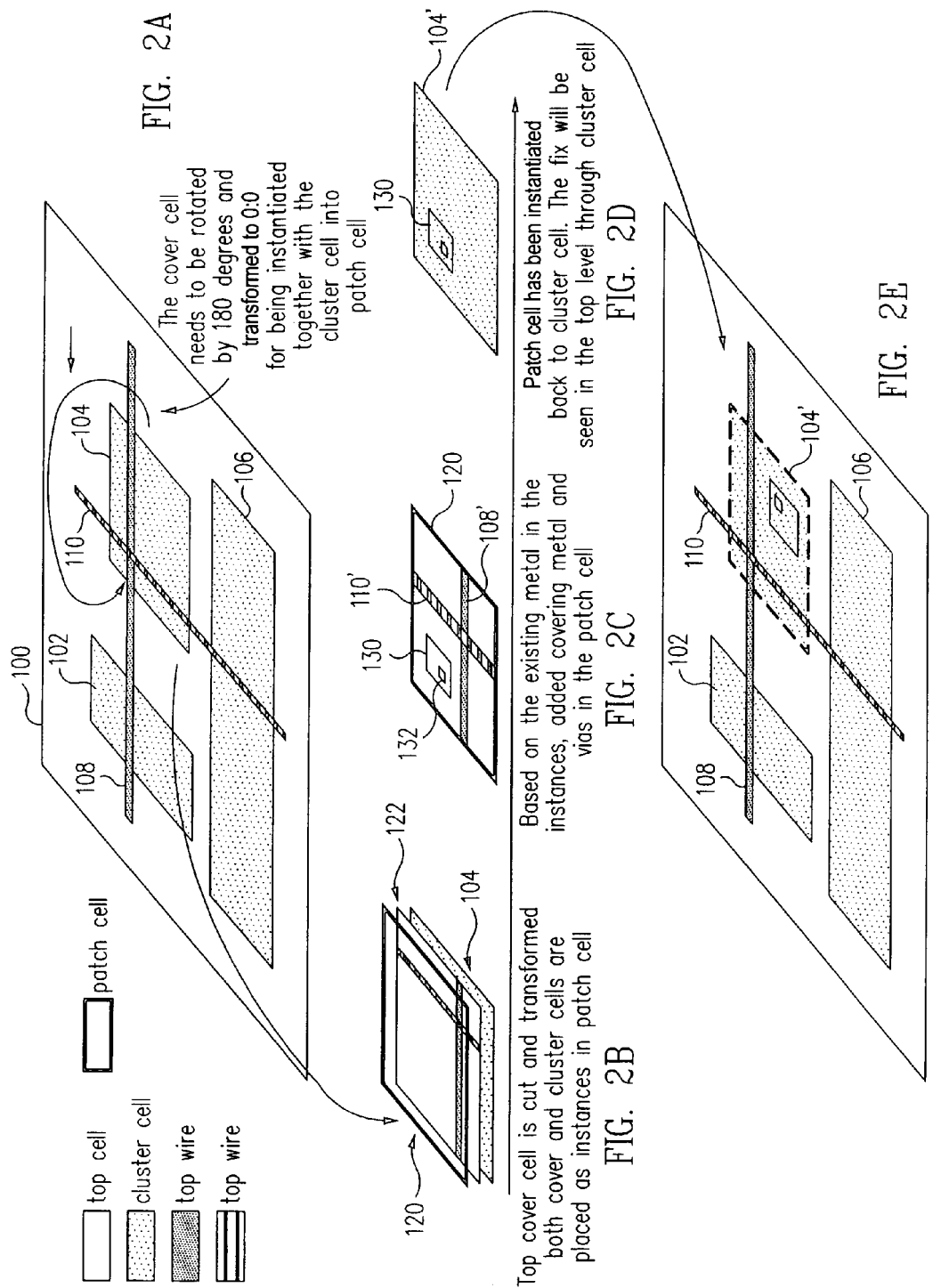

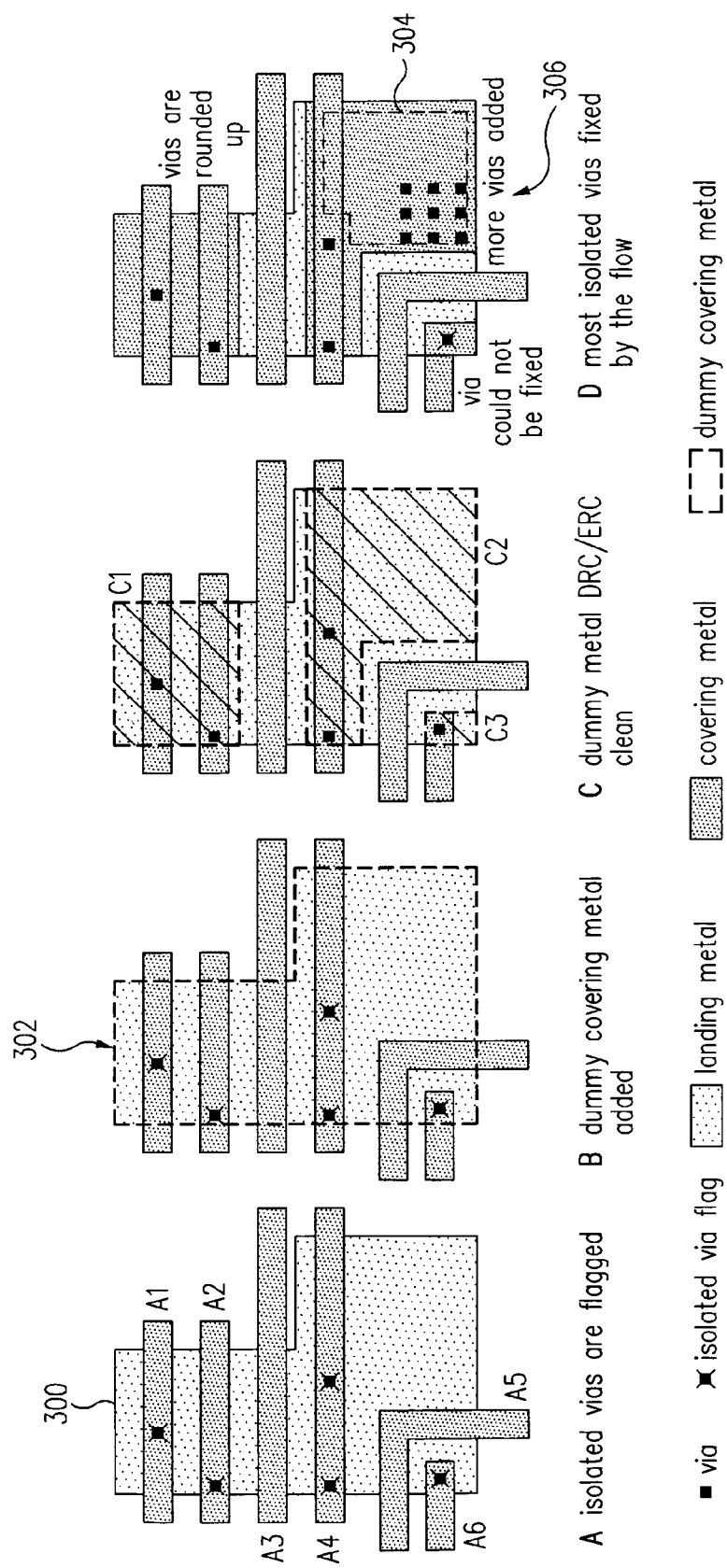

METHOD AND APPARATUS FOR EFFICIENTLY LOCATING AND AUTOMATICALLY CORRECTING CERTAIN VIOLATIONS IN A COMPLEX EXISTING CIRCUIT LAYOUT

BACKGROUND

1. Field of the Invention

The present invention relates to error checking and manipulation of a design layout, and more particularly to computer aided design layout and design rule verification of an integrated circuit design layout, and use thereof for circuit fabrication.

2. Background of the Invention

Design of an electronic circuit, for example, an integrated circuit (IC), is a complicated and time consuming process. FIG. 1 illustrates a typical design flow 80 of an integrated circuit device from conception through the generation of a fabrication ready design layout. Generally, design flow 80 commences with defining the design specifications or requirements, such as required functionality and timing, at step 82. The requirements of the design are implemented, for example, as a netlist or electronic circuit description, at step 84. The implementation can be performed by, for example, schematic capture (drawing the design with a computer aided design tool) or more typically, utilizing a high level description language such as VHDL, Verilog® and the like. The implemented design is simulated to verify design accuracy, at step 86. Design implementation and simulation are iterative processes. For example, errors found by simulation are corrected by design implementation and re-simulated.

Once the design is verified for accuracy with simulation, a design layout of the design is created, at step 88. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), at step 90. The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, at step 92. The extracted circuit identifies individual transistors and interconnections, for example, on various layers, as well as the parasitic resistances and capacitances present between the layers. A layout versus schematic check (LVS) is performed, at step 94, where the extracted netlist is compared to the design implementation created in step 84. LVS ensures that the design layout is a correct realization of the intended circuit topology. Any errors such as unintended connections between transistors, or missing connections/devices, etc. must be corrected in the design layout before proceeding to post-layout simulation, step 96. The post-layout simulation is performed using the extracted netlist which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and manufacturability and reliability of the circuit. For example, the density of a layer can be increased, additional vias added to interconnection areas, and the like. Creation of a design layout and performing DRC become critical time consuming processes. Performing a DRC and manipulation of the design layout often requires manual interaction from the designer. More reliable and automated techniques for improving the design layout are consistently desired.

In a modern semiconductor design technology, many metal layers are used to implement interconnections throughout an integrated circuit. For some integrated circuits, one or more polysilicon (poly) layers are also used to implement interconnections. Vias are used to connect from one such metal or polysilicon layer to another metal or polysilicon layer. For example, a via may be used to connect a feature (i.e., a design geometry) on each of two metal layers. The lower one of the two layers is referred to as the landing metal layer and the upper one of the two layers is referred to as the covering layer. A via between a landing metal layer $mt_x$ and the covering metal layer $mt_{x+1}$ is usually referred to as a $v_x$ via (i.e., using the same subscript designation as the landing metal layer).

Most design technologies include via enclosure rules to ensure that both the landing metal and the covering metal enclose the via by a certain amount. In other words, such an enclosure rule ensures that each metal layer overlaps a via with a certain amount of extra metal, to ensure that the via provides a good connection between the two metal layers once fabricated. The design rule specifying the extra amount of metal around each via may be referred to as a metal enclosure of a via design rule, and at times simply as a via enclosure design rule.

In a modern semiconductor design technology, especially for a deep sub-micron design, poly and metal layers which are used to implement connections through vias apply different via enclosure rules depending on the width of the metal or poly in the vicinity of the via. When a via is placed in a wide metal area, it may need more metal enclosure than that of a via which is placed in a narrower metal area. When a via is partially in wide metal area and partially in non-wide metal area, it may need different metal enclosure in each different area. In general, as the design technology advances, more and more wide classes of metal features may be used in a design layout, having different metal enclosure design rules for each wide metal class. Automated techniques are desirable for interacting with a design layout which includes multi wide class objects without causing false errors (or false passes), and additional improvements are needed.

SUMMARY

In a deep sub micron semiconductor design, vacancy concentration sometimes causes a higher failure rate on single vias which are located at the center part of a wide landing metal or covering metal geometry, known as an isolated via. It has been observed that putting some extra vias (known as redundant vias) between the same landing and covering metal as the isolated via, results in the vias sharing the vacancy load, so the risk of via failure is reduced and reliability is enhanced. Vias which are close together and vias which are close to the edge of the metal geometry may also benefit from alteration of the stress gradients responsible for vacancy transport, and likewise reduce the risk of via failure. In other words, this type of failure can be substantially reduced by adding a (redundant) via next to the pre-existing (isolated) via or putting the via close to the metal edge. This implementation can be done relatively easily for a new design layout. However, for an existing large scale layout, it is extremely difficult and, in many cases, not practical.

To avoid such isolated vias, a redundant via design rule check may be performed on design layouts. An exemplary redundant via design rule check may ensure that for vias placed within a connection area (i.e., an area having at least one via connecting it to another metal layer) of a metal feature (or within a localized region of a larger metal geometry) that is both greater than a certain width and greater than a certain area in size, the vias are both sufficient in number and/or proper in their location (e.g., close to each other, close to an edge of the area, etc.). Such redundant via checks may be performed on landing metal, on covering metal, or both. A redundant via design rule may apply differently on different classes of objects which are defined by both minimum width and minimum area. Sometimes, such a redundant via test may be waived for any connection area having at least a certain minimum number of vias therewithin.

As design technology advances, rules such as the above-mentioned redundant via rule may become known well after all or a great portion of a complex sub-micron design layout is complete. Having to test for, and make necessary changes to accommodate, such a rule on a cell-by-cell basis would significantly increase the design cycle for the integrated circuit. The present invention provides for automatically testing and correcting most instances (i.e., occurrences) of errors such as isolated via violations, particularly for existing design layouts, and to reduce dramatically, if not eliminate, the number of such errors that must be manually edited to correct the violation. In an exemplary embodiment of the invention, a design flow is described to identify all the existing isolated vias, and place redundant vias next to them so that the product reliability is not compromised.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 2A, 2B, 2C, 2D, and 2E depict an exemplary design layout, showing a top cell layout including several cluster cells (in FIG. 2A), a patch cell for one of the cluster cells (in FIG. 2B), covering metal features and vias added to the patch cell to correct isolated via violations detected in the patch cell (in FIG. 2C), an instantiation of the patch cell into the cluster cell after correction of the isolated via violations (in FIG. 2D), and the modified cluster cell as instantiated in the top-level cell (in FIG. 2E) to collectively better illustrate an exemplary embodiment of the present invention.

FIGS. 3A, 3B, 3C, and 3D depict a portion of a patch cell in an exemplary design layout, showing several occurrences of isolated via violations (in FIG. 3A), dummy covering metal features added to the patch cell within a landing area containing at least one isolated via (in FIG. 3B), remaining dummy covering metal features after performing design rule and electrical rule checks (in FIG. 3C), and additional vias added within the covering metal regions to further correct remaining isolated via violations (in FIG. 3D), to collectively better illustrate an exemplary embodiment of the present invention.

The use of the same reference symbols in different drawings indicates similar or identical items.

DETAILED DESCRIPTION

Figure 1:
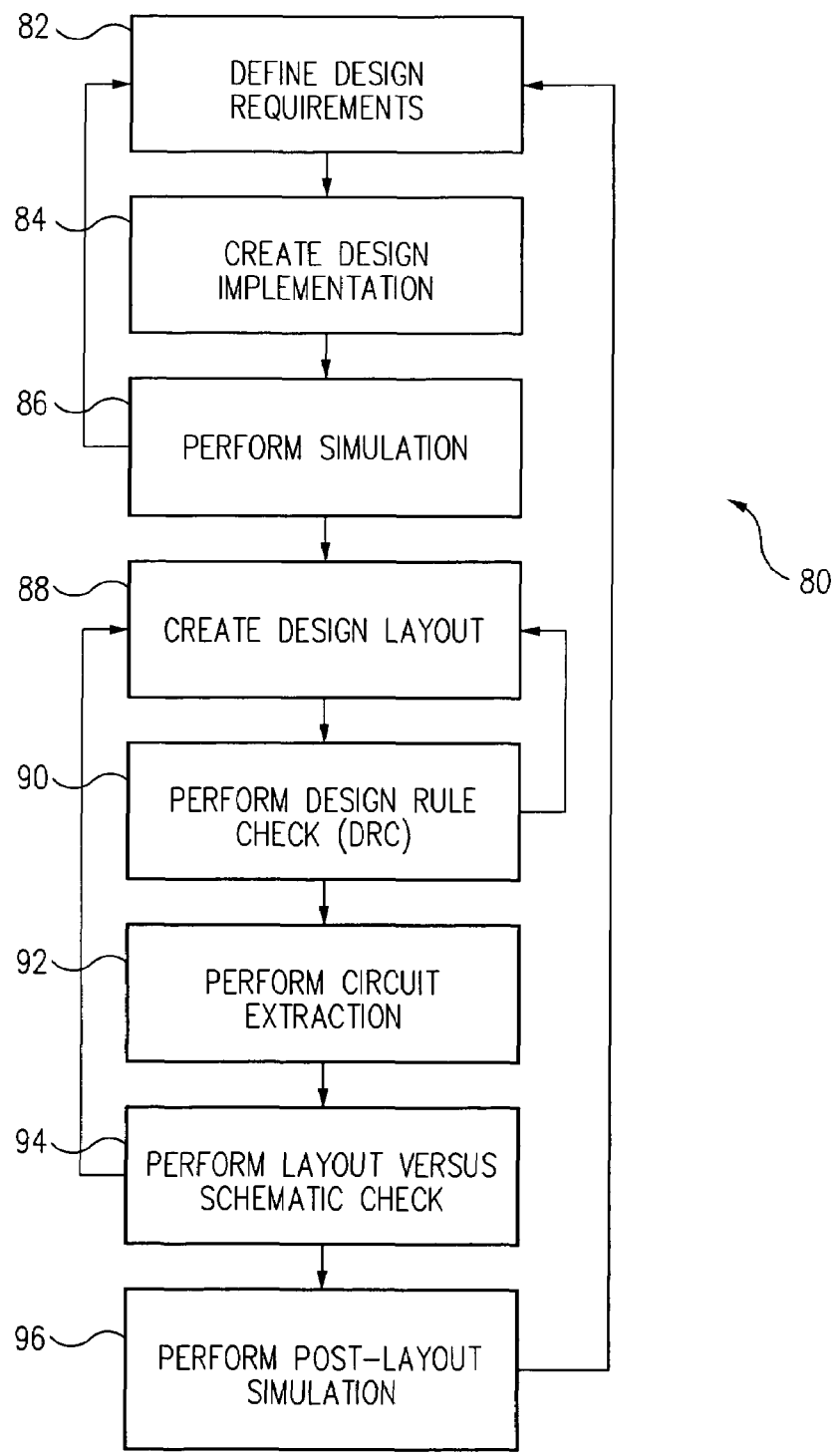
FIG. 1, labeled prior art, illustrates an exemplary design flow 80 for an integrated circuit device.

In many design flows, Electronic Design Automation (EDA) functions are used to extract Pure Fill Via Areas (PFVA) for each metal layer. A PFVA is an artificial object or geometry, which has been pre-shrunk from the original geometry by the correct enclosure amount, which depends on whether the PFVA is within a wide metal area or not. A via can be dropped (i.e., placed) anywhere within such a PFVA without violating the respective via metal enclosure rules. A Layer Pure Fill Via Area (LPFVA) is an area which meets the metal enclosure rule for the specific metal layer. In other words, a via can be placed anywhere inside the area without violating the specific metal enclosure design rule for any wide class. A $v_x$ PFVA is the common area of a $mt_x$ LPFVA and a $mt_{x+1}$ LPFVA. In this common area, a $v_x$ via meets metal enclosure design rules for both metal layers $mt_x$ and $mt_{x+1}$ anywhere. A LPFVA may be used for filling vias into the area without violating a specific metal layer enclosure design rule. Similarly, a $v_x$ PFVA may be used for filling $v_x$ vias into the area without violating a specific metal layer enclosure design rule on either the $mt_x$ or $mt_{x+1}$ metal layers. Additional details and preferred embodiments for extracting Pure Fill Via Areas are described in co-pending U.S. application Ser. No. 10/260,816 entitled "Pure Fill Via Area Extraction in a Multi-Wide Object Class Design Layout", by Mu-Jing Li and filed on Sep. 30, 2002, and in co-pending U.S. application Ser. No. 10/260,814 entitled "Correction of Spacing Violations Between Pure Fill Via Areas in a Multi-Wide Object Class Design Layout", by Mu-Jing Li, and filed on Sep. 30, 2002, each of which is incorporated by reference in its entirety.

In the description that follows, a suitable redundant via design rule check may be assumed to check each connection area within a region of a metal geometry that is both greater than a certain width and greater than a certain area in size, to ensure that vias placed within the connection area are both sufficient in number and/or proper in their location.

The following code illustrates such an exemplary redundant via rule for a $v_x$ via layer.

| | | |
|---|---|---|
| 61 | VxMtIsovWidth = 1.80; | Min mt width for non isolated vx |
| 62 | VxMtIsovArea = 32.0; | Min mt area for non isolated vx |
| 63 | VxIsovToVx = 0.64; | Max spacing between two non isolated vx |
| 64 | VxIsovToMtEdge = 0.32; | Min enclosure for non isolated vx |
| 65 | VxMtIsovMinVia = 2; | Min vx for mt |
| 66 | VxMtWIsovWidth = 3.6; | 2nd wide mt for isolated via checking |
| 67 | VxMtWIsovArea = 127.0; | 2nd wide mt area isolated via checking |
| 68 | VxMtWIsovMinVia = 3; | Min vx for 2nd wide mt |
| 69 | VxIsovNotCheck = 6; | Min via not to check isolated via |
| 70 | VxIsovMaxViaAdd = 10; | Max redundant vias to be placed |

These rule statements may be interpreted as follows. There are two wide classes of a metal layer mtx eligible for isolated via checks. The first class is for those mtx areas which meet a width greater than VxMtisovWidth and which meet an area greater than VxMtIsovArea. Any mtx+1 overlapping with those areas and having at least one via (thus defining a connection area) should have at least VxMtisovMinVia (e.g., two) vias which should meet at least one of the following two rules: (1) the two vias are separated from each other by no more than VxIsovToVx, or (2) at least one of the vias is within the range of VxIsovToMtEdge to the $mt_x$ edge (i.e., "close" to the metal edge). The rule also specifies that whenever a connection area contains VxIsovNotCheck or more vias, the redundant via rule can be waived for this area, and further, if redundant vias are added by an automated routine, then no more than VxIsovMaxViaAdd such vias need be added. Each of these specific tests for a wide class may be termed a component test or constituent test for the class, and greater or fewer numbers of constituent tests may be employed for each wide class.

The second wide class is for those metal layer mtx areas which meet a width greater than VxMtWIsovWidth and which meet an area greater than VxMtWIsovArea. Any mtx+1 overlapping with those areas and having vias (i.e., a connection area) should have at least VxMtWIsovMinVia (e.g., three) vias which should meet at least one of the following two rules: (1) at least two of the three vias are separated from each other by no more than VxIsovToVx, or (2) at least one of the vias is within the range of VxIsovToMtEdge to the mtx edge. The rule also specifies that whenever an mtx+1 area which is overlapping with the landing metal mtx (i.e., a connection area) contains VxIsovNotCheck or more vias, the redundant via rule can be waived for this area. Such specific numbers expressed are in the above rule are exemplary, and may be determined empirically for a particular semiconductor process. Other values are contemplated, as are other similar types of rule checks.

To perform an isolated via rule check (i.e., a "redundant via" rule check), the landing metal should preferably be separated into wide class object sets $w_0, w_1, w_2, \ldots w_n$ derived from the original geometries. Additional details and preferred embodiments for separating geometries of a layer into wide class object sets (i.e., wide class objects) is described in co-pending U.S. application Ser. No. 10/260,813 entitled "Structure and Method for Separating Geometries in a Design Layout into Multi-Wide Object Classes", by Mu-Jing Li and Amy Yang, and filed on Sep. 30, 2002, which application is incorporated by reference in its entirety.

Wide class objects are not real geometries, but rather are artificial objects. Although $w_0$ objects contain all real edges (i.e., non-virtual edges) which are coincident with the edges of the geometry, higher class objects ($w_1, w_2, \ldots w_n$ objects) can contain virtual edges. A virtual edge may be defined as an edge or an edge segment of an artificial object that is not coincident with an edge of the geometry from which it was derived. In other words, a virtual edge is coincident with a wide class object edge and is inside the geometry from which it was derived. A virtual vertex may be defined as a vertex on a wide class object formed by at least one virtual edge, but is not a real vertex on the geometry from which it was derived. Virtual edges and virtual vertices may together be referred to as forming a virtual boundary, while conversely, non-virtual edges (i.e., real edges) and non-virtual vertices (i.e., real vertices) may together be referred to as forming a non-virtual boundary (i.e., real boundary).

When deriving multiple wide class objects from a geometry, the rules for higher class objects preferably should not be applied to the virtual edges. Preferred algorithms to check the redundant via design rule advantageously treat virtual and non-virtual edges differently when deciding whether a particular via is a true isolated via. As may be inferred from the exemplary rule set depicted above, each wide class of objects may be tested according to a respective rule for each higher class of objects. Additional details and preferred embodiments for identifying isolated vias in a multi-wide class object set design layout are described in co-pending U.S. application Ser. No. 10/260,817 entitled "Redundant Via Rule Check in a Multi-Wide Class Object Class Design Layout", by Mu-Jing Li and Amy Yang, and filed on Sep. 30, 2002, which application is incorporated by reference in its entirety.

As used herein, a via connects two metal layers: a landing metal and a covering metal. For a specific type of via, the landing metal and covering metal can be exchanged depending on which metal layer we are focusing on. For example, assuming that a via v1 connects metal layers m1 and m2, when focusing on isolated vias on the m1 layer, the landing metal may be viewed as m1, and the covering metal may be viewed as m2. However, when focusing on isolated vias on the m2 layer, the landing metal may be viewed as m2, and the covering metal may be viewed as the m1 layer.

One or more exemplary methods for finding isolated vias are preferably implemented as a module, which may be invoked at different times within an isolated via correction design flow.

Locating the isolated vias is a start, of course, but does not end the task at hand. When testing a completed large scale layout design for isolated vias, the number of violations is likely huge, especially in the lower level vias (i.e., connecting the lower-most metal layers). One could not afford to manually fix all of the isolated vias sub-cell by sub-cell. This results not only because of time to market concerns, but also because of changing a sub-cell in the hierarchy could cause new violations in higher level cells of the design layout. In a limited CAD resource environment, trying to fix all the isolated vias in a reasonable period of time, without changing the design architecture, is traditionally a real challenge.

In one embodiment of the present invention, the strategy used is to cut the whole design into a number of pieces by generating a patch cell for each cluster cell. A cluster cell is a design unit which is only instantiated once on the top level of the design layout, or at some level below the top level. The patch cell includes the metal features and vias on the upper levels in the region into which the cluster cell is instantiated (e.g., the metal layers and vias "above" the cluster cell in the top level layout). This strategy divides a large scale design into smaller manageable pieces, which are cluster cells, and simplifies the complex upper level design to an upper level cover cell to contain only the necessary design entities for fixing the isolated vias within the given cluster cell.

During this process, the patch cell provides two important roles. It serves as a holding cell, to hold both the lower level and upper level design entities (i.e., features) to represent the design in this area. It also serves as a working platform, to hold new features, such as covering metal and redundant vias added by the design flow. By using such a patch cell, the data size becomes small enough so that locating and correcting isolated vias on a given patch cell can be completed in a reasonable time. This design flow is also suitable for parallel processing, for each cluster cell may be processed independently.

Isolated vias are identified within the patch cell, and most such violations are automatically corrected by adding metal features and vias in the patch cell, without changing the design architecture. That is, additional vias and covering metal are added to the patch cell to form redundant vias, or to increase the size of metal features already present to thereby create more room for "rounding up" vias (whether existing or newly added) to meet the isolated via design rules. The same design flow may be employed to loop through all such via layers (e.g., v1, v2, . . . vn).

An exemplary use of such a patch cell is depicted in FIGS. 2A–2E. Referring now to FIG. 2A, a design layout includes a top-level cell 100, and cluster cells 102, 104, 106. Two metal features 108, 110 within the top-level cell 100 are also shown.

Referring now to FIG. 2B, a patch cell 120 is created which is associated with the cluster cell 104. The patch cell 120 is initially empty, but is used to hold both the lower and upper level design entities shown in FIG. 2A. The cluster cell 104 may be instantiated into the patch cell 120 to hold the lower level design features, as shown. Alternatively, a subset of the features from the cluster cell may be included in the patch cell. For example, in certain applications, only the metal features may need to be included, without necessarily including underlying polysilicon and implant features.

The metal and via features from one or more upper-level cells (here represented by a single top-level cell 100) may be copied, coordinate translated, and the translated features incorporated within the patch cell 120. Preferably, a module may be employed to "snap shot" all the metal and via features in the upper-level cell(s) where the cluster cell is instantiated to form an upper level cover cell 122 that is instantiated into the patch cell 120. In the example shown, the upper level cover cell 122 is translated from the top-level cell 100 coordinates to the patch cell coordinates. Such a coordinate translation may include a rotation of the cell orientation, and a shifting of the cell origin, both of which may be seen in the figure. In particular, the cluster cell 104 is shown as having been instantiated into the top-level cell 100 with a 180 degree orientation, the top-level cover cell 122 is also rotated by 180 degrees when instantiated into the patch cell 120, and also has its origin set to align its features with the underlying cluster cell 104 which is also instantiated into the patch cell 120.

As a result, the patch cell 120 reflects the design layout from the top level cell 100 down to and including the cluster cell 104 (in the portion of the layout where the cluster cell is instantiated in the top-level cell 100). Since the patch cell contains all of the features necessary for testing and correcting the particular errors in question (e.g., isolated vias), and the patch cell represents a complete working platform for the design flow to process. Such a procedure transforms a very complex situation into a single cell, so the design flow can be simplified to focus only working on a properly created patch cell.

As described in further detail below, isolated vias may be identified within the patch cell, and extra pieces of metal (i.e., extra metal features) and additional (i.e., redundant) vias added to the patch cell. Referring now to FIG. 2C, an added covering metal feature 130, along with an added redundant via 132, are shown as having been added to the patch cell 120. These two features are shown to represent the numerous such features likely to be added to realistically-sized cells. The added covering metal features 130 will serve to either "round up" more vias for a connection area, or provide extra covering room for adding more vias, to correct an isolated via violation. By adding such features to the patch cell, the design flow avoids changing the design hierarchy, relying instead on correcting the isolated vias on the respective patch cell for each respective cluster cell.

For a given patch cell, after processing all the via layers (v1, v2, etc.), the exemplary design flow deletes the cluster cell 104 instance and the upper level cover cell 122 instance from the patch cell 120, and leaves only the metal and vias that were added to form redundant vias, thereby removing all but the added features from the patch cell. The patch cell 120 is then preferably instantiated into the cluster cell 104, as shown in FIG. 2D (labeled as 104'). Alternately, the patch cell may be instantiated at a higher level of the design layout, such as at the top level.

Since the cluster cell 104' now includes an instance of the patch cell 120, the added features 130, 132 are immediately reflected into the top-level cell 100 by virtue of the instantiation of cluster cell 104', as depicted in FIG. 2E, and the redundant via rule violations are thereby corrected.

FIGS. 3A–3D depicts an exemplary design layout within a hypothetical patch cell, and illustrates how the design flow automatically fixes many of the identified isolated via violations. Referring now to FIG. 3A, a landing metal feature 300 is shown, which may be assumed to entirely be within the w1 wide object class, while the lower half of the landing metal feature 300 is also in the w2 wide object class. All the vias depicted in FIG. 3A are isolated vias according to the above-described redundant via design rules. An exemplary design flow is described below.

Initially, an isolated via identification module is invoked a first time to find and identify all isolated vias within the patch cell. Such isolated vias may be identified in any suitable manner, such as by flagging them with an attribute, covering them with another feature, or any of a variety of suitable methods which may be available in the CAD system being utilized. As may be seen in FIG. 3A, all the vias are flagged as isolated vias. Each either violates the first wide object class redundant via design rule, such as vias in A1 and A2, or violates the second wide object class redundant via design rule, such as vias in A4 and A6.

Whenever a wide landing metal overlaps multiple covering metal pieces, and they contain the same type of via, all actually belong to same electrical node. Covering metal features A1, A2, A4, and A6 actually belong to the same electrical node because each connects to the same landing metal feature 300 through at least one via, while covering metal features A3 and A5 belong to one or two different nodes.

After identifying the isolated vias, the flow preferably invokes a module to fill dummy covering metal features within those wide landing metal features which contain at least one identified isolated via. As used herein, such dummy metal features placed within the wide landing metal features may be placed coincident with the wide landing metal features. In most cases adding dummy covering metal will cause DRC and ERC violations. As can be seen in FIG. 3B, the added dummy covering metal feature 302 is shown in a dashed line coincident with the landing metal feature 300. As a result, the covering metal features A3 and A5 have been shorted together with node representing features A1, A2, A4, and A6.

Next, a DRC/ERC correction module may be employed to correct possible DRC/ERC violations. FIG. 3C shows the result of the correction process. As we can see, A3 and A5 have been separated from any other covering metal piece; A1 and A2 have been merged by DRC/ERC clean dummy covering metal feature C1; and A4 and A6 have been merged with dummy covering metal features C2 and C3, respectively.

An exemplary DRC/ERC correction module may include: (1) cutting the dummy metal to meet the $w_0$ to $w_n$ class spacing rules between the dummy and unrelated existing covering metal; (2) cutting the dummy metal to meet the $w_0$ to $w_n$ class spacing rules between the dummy and related existing covering metal; (3) cutting the dummy metal to meet the minimum covering metal width; and (4) cutting the dummy metal to meet the $w_0$ to $w_n$ class spacing rules between the dummy metal pieces. Such steps may be repeated as necessary. Additional details and preferred embodiments of exemplary techniques for adding dummy metal, and for performing DRC/ERC corrections thereto, are described in the following co-pending U.S. Applications, each of which is incorporated by reference in its entirety: application Ser. No. 10/201,102 entitled "Automated Design Rule Violation Correction When Adding Dummy Geometries to a Design Layout," by Mu-Jing Li, filed on Jul. 23, 2002; application Ser. No. 10/201,072 entitled "Correction of Spacing Violations Between Dummy Geometries and Wide Class Objects of Design Geometries" by Mu-Jing Li, filed on Jul. 23, 2002; application Ser. No. 10/201,071 entitled "Correction of Spacing Violations Between Design Geometries and Wide Class Objects of Dummy Geometries," by Mu-Jing Li, filed on Jul. 23, 2002; application Ser. No. 10/201,044 entitled "Correction of Spacing Violations Between Wide Class Objects of Dummy Geometries," by Mu-Jing Li, filed on Jul. 23, 2002; and application Ser. No. 10/201,101 entitled "Correction of Width Violations of Dummy Geometries," by Mu-Jing Li, filed on Jul. 23, 2002.

With the dummy covering metal features in place, the exemplary flow preferably invokes the isolated via finding module the second time. As can be seen in FIG. 3D, isolated vias in A1 and A2 now serve as redundant vias for each other because, although they are not within a distance of each other of less than VxIsovToVx, the via in A2 is within the range of VxIsovToMtEdge from an edge of the landing metal feature 300. Since these vias are within the wide object class w1 area and not within the wide object class w2 area, each now passes the isolated via check. Vias in A4 and A6 are still flagged as isolated vias.

Based on the second phase flagged isolated via test, the exemplary flow then preferably invokes a module to extract Pure Fill Via Areas (PFVA) on all common areas (i.e., overlapping areas) between wide landing metal and dummy covering metal which contain at least one isolated via. As described above, PFVA's are areas within which a via array can be placed anywhere without violating the relevant metal enclosure and via spacing design rules. In a design flow which works on a multi wide metal class design technology, such a step may be extremely important to ensure correct placement of added vias and via arrays. One such PFVA 304 is shown in FIG. 3D.

Based on the extracted PFVA's, the design flow may continue by invoking a redundant via fill module to add vias to each PFVA in order to support the associated isolated via. As can be seen from FIG. 3C, metal feature A4 has been expanded by the dummy covering metal C2 to allow more vias to support the two isolated vias within metal feature A4. FIG. 3D shows a 3×3 via array 306 has been added to allow the expanded A4 feature to contain 11 via cuts, which now meets rule VxIsovMaxViaAdd and VxIsovNotCheck requirements. With the newly added via array 306, isolated vias in the original A4 feature are no longer isolated via violation, and should not be flagged as such in subsequent phases of the design flow. The A6 feature was only able to be expanded a little bit, and is not large enough to support a PFVA, that is, there is no extra room for adding another via. Therefore, the via in metal feature A6 is still an isolated via. Additional details and preferred embodiments of exemplary via array filling techniques are described in co-pending U.S. application Ser. No. 10/461,041 entitled "Method, Apparatus, and Computer Program Product for Generation of a Via Array Within a Fill Area of a Design Layout", by Mu-Jing Li, and filed on Jun. 13, 2003, which application is incorporated by reference in its entirety.

Finally, the exemplary design flow invokes the isolated via finding module again. This time, only the via in A6 gets flagged as an isolated via, and needs to be fixed manually. Such flagged vias may be output on a via debug cell. Most of these violations that are not automatically corrected are due to very tight design structures. To correct some of these vias, a layout designer may need to change the underlying cell design somewhat, by including extra vias, or moving the existing vias around. The user may reference the debugging cells to manually fix any remaining uncorrected isolated vias by changing the design slightly in the patch cell (which includes an instantiation of the cluster cell). Then, as described above, the cluster cell instance and the top-level cover cell instance may be deleted from the patch cell, and the patch cell then instantiated into the cluster cell to memorialize the corrections.

A design flow such as that described can correct a great many (e.g., 95–99%) of the isolated via violations in a complex design layout. The flow may be carried out in parallel for all the cluster cells within a top-cell layout and completed in a reasonable period of time.

It is appreciated that operations discussed herein may consist of directly entered commands by a computer system user, but the preferred embodiment includes steps executed by software modules. The functionality of step referred to herein may correspond to the functionality of modules or portions of modules. In addition to software modules, the above flows or portions of flows can be implemented as application instructions or menu items. For example, a sizing operation which only sizes non-virtual edges of an object by a sizing factor can be an application instruction provided by an EDA tool provider according to some embodiments of the present invention.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention. Line numbers on any exemplary code sections or modules are used for ease of reference, and should not be taken to require any particular order between separately described modules.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

The use herein of a convenient set nomenclature such as "a plurality of wide class object sets $w_0, w_1, w_2, \ldots w_n$," need not imply that n must be greater than 2. Rather, n may be equal to 1, in which case there need be only one wide class of objects in addition to the original design geometries themselves, which are represented by the $w_0$ class. Moreover, n may alternatively be equal to 2 or more than 2.

As used herein, a first feature placed within a second feature includes the possibility, although not the necessity, that the first feature is coextensive with the second feature. Moreover, to say that a first cell includes metal features from a second cell does not necessarily imply that the first cell includes all the metal features from the second cell, nor does it imply that it includes all the features from a particular metal layer of the second cell. Rather, the first cell merely includes at least some metal features from at least one metal layer of the second cell.

Although the above embodiments may have been described in reference to a specific vendor's EDA tools and code segments utilizing the Diva language code, the techniques described herein can be applicable to and make use of any EDA tools, electronic circuit layout, and implemented in any code language. Moreover, although the above embodiments have been described in relation to integrated circuit layouts, the techniques described herein can be equally useful in the layout of other electronic devices, for example in a layout of a printed wiring board.

While methods for processing design layouts are described herein and are generally presumed, it is well recognized that in modern semiconductor design and fabrication, such methods may be embodied in computer readable descriptive form suitable for use in subsequent design or fabrication activities. Accordingly, claims directed to methods may, consistent with particular language thereof, read upon computer readable encodings and representations of same, whether embodied in media or combined with suitable reader facilities to allow fabrication, test, or design refinement of the corresponding circuits and/or structures conveyed in a design layout. The invention is contemplated to include methods for processing design layouts, circuits fabricated using such methods, related methods for making such circuits using such methods for processing design layouts, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

Realizations in accordance with the present invention have been described in the context of particular embodiments. These embodiments are meant to be illustrative and not limiting. Many variations, modifications, additions, and improvements are possible. For example, the invention is contemplated for use in correcting layout deficiencies other than isolated vias. Plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for use with a design layout, said method comprising the steps of:
    creating a patch cell for a given cell of the layout, said patch cell including at least some features from higher level cells above the given cell, and further including at least some features from the given cell;
    identifying layout errors in the patch cell;
    adding features to the patch cell to correct one or more of the identified errors;
    removing all but the added features from the patch cell; and then
    instantiating the patch cell into the layout to thereby effectuate the patch cell corrections into the layout.

2. The method of claim 1 wherein the given cell comprises a cluster cell.

3. The method of claim 1 wherein the patch cell includes metal and via features from higher level cells above the given cell.

4. The method of claim 1 wherein the patch cell includes metal and via features from the given cell.

5. The method of claim 1 wherein the patch cell includes an instantiation of the given cell.

6. The method of claim 1 wherein the added features comprise metal features.

7. The method of claim 6 wherein the added features further comprise via features.

8. The method of claim 1 further comprising flagging any identified errors which remain uncorrected.

9. The method of claim 1 wherein the patch cell is instantiated into the given cell.

10. The method of claim 1 wherein the patch cell is instantiated into the layout at a level above the given cell.

11. The method of claim 1 further comprising creating a respective patch cell for each respective cell at a given level of the layout, and carrying out the enumerated steps for each respective patch cell.

12. The method of claim 1 wherein the identifying step comprises identifying isolated vias.

13. The method of claim 12 wherein the adding step comprises adding dummy metal features within landing areas containing one or more identified isolated vias.

14. The method of claim 13 wherein the adding step further comprises processing the dummy metal features to ensure compliance with design rule checks (DRC) and electrical rule checks (ERC).

15. The method of claim 14 wherein the adding step further comprises joining covering metal features associated with a single electrical node by at least one of said dummy metal features within a landing area containing one or more identified isolated vias.

16. The method of claim 15 further comprising the steps of:
identifying isolated vias remaining after performing the adding step; and
adding via fill arrays within eligible via fill areas associated with identified isolated vias.

17. The method of claim 16 further comprising flagging any isolated vias remaining after performing the adding via fill arrays step.

18. The method of claim 12 wherein the adding step comprises adding additional vias.

19. The method of claim 1 wherein a representation of the design layout is encoded in one or more design files for an electronic circuit.

20. An electronic circuit fabricated from a design layout representation thereof, said design layout being generated by the method recited in claim 1.

21. A method for correcting an existing design layout, said method comprising the steps of:
creating a patch cell for a cluster cell of the layout, said patch cell including covering metal features from higher level cells above the cluster cell, and further including metal and via features from the cluster cell;
identifying isolated vias in the patch cell layout;
adding dummy metal features to the patch cell within landing areas containing one or more identified isolated vias; then
identifying remaining isolated vias in the patch cell layout;
adding via fill arrays within landing areas containing one or more identified isolated vias;
removing all but the added features from the patch cell;
flagging any identified isolated vias which remain uncorrected; and then
instantiating the patch cell into the layout to thereby effectuate the patch cell corrections into the layout.

22. The method of claim 21 wherein the patch cell creating step includes instantiating the cluster cell into the patch cell.

23. The method of claim 21 wherein the patch cell creating step includes copying metal features from upper-level cells above the cluster cell, transforming coordinates and orientation of said copied metal features if different than the patch cell, and including said transformed features into the patch cell as covering metal features.

24. The method of claim 21 wherein the patch cell instantiating step comprises instantiating the patch cell into the cluster cell.

25. The method of claim 21 wherein the patch cell instantiating step comprises instantiating the patch cell into the layout at a level above the cluster cell.

26. The method of claim 21 further comprising repeating the enumerated steps for each respective cluster cell in the layout.

27. The method of claim 21 wherein the dummy metal features adding step further comprises:
processing the dummy metal features to ensure compliance with design rule checks (DRC) and electrical rule checks (ERC) relative to existing metal features and to other dummy metal features, and joining covering metal features associated with a single electrical node by at least one of said dummy metal features within a landing area containing one or more identified isolated vias.

28. A method of making a computer readable media product that encodes a design file representation of a design layout of an electronic circuit, said method comprising the steps of:
creating a patch cell for a given cell of the layout, said patch cell including at least some features from higher level cells above the given cell, and further including at least some features from the given cell;
identifying layout errors in the patch cell;
adding features to the patch cell to correct one or more of the identified errors;
removing all but the added features from the patch cell; and then
instantiating the patch cell into the layout to thereby effectuate the patch cell corrections into the layout; and
encoding the design layout into a computer readable medium.

29. The method of claim 28 wherein the patch cell includes metal and via features from the given cell.

30. The method of claim 28 wherein the added features comprise metal and via features.

31. The method of claim 28 wherein the identifying step comprises identifying isolated vias.

32. A computer readable encoding of an electronic circuit design, the computer readable encoding comprising:
one or more design file media encoding representations of a design layout for the electronic circuit design;
wherein the computer readable encoding of the electronic circuit design was generated by the steps of:
creating a patch cell for a given cell of the layout, said patch cell including at least some features from higher level cells above the given cell, and further including at least some features from the given cell;
identifying layout errors in the patch cell;
adding features to the patch cell to correct one or more of the identified errors;
removing all but the added features from the patch cell; and then
instantiating the patch cell into the layout to thereby effectuate the patch cell corrections into the layout.

33. The computer readable encoding of claim 32 wherein the patch cell includes metal and via features from the given cell.

34. The computer readable encoding of claim 32 wherein the added features comprise metal and via features.

35. The computer readable encoding of claim 32 wherein the identifying step comprises identifying isolated vias.

36. An apparatus for processing one or more design files for an electronic circuit, the one or more design files encoding representations of a design layout of the electronic circuit, said design layout having vias connecting geometries of a first layer to geometries of a second layer, said apparatus comprising:
- means for creating a patch cell for a given cell of the layout, said patch cell including at least some features from higher level cells above the given cell, and further including at least some features from the given cell;
- means for identifying layout errors in the patch cell;
- means for adding features to the patch cell to correct one or more of the identified errors;
- means for removing all but the added features from the patch cell; and
- means for instantiating the patch cell into the layout to thereby effectuate the patch cell corrections into the layout.

37. The apparatus of claim 36 wherein the patch cell includes metal and via features from the given cell.

38. The apparatus of claim 36 wherein the added features comprise metal and via features.

39. The apparatus of claim 36 wherein the identifying step comprises identifying isolated vias.

40. A computer readable encoding of instructions for a computer, said instructions encoding a method for use with a design layout, for identifying and correcting layout errors within the design layout, said encoded method comprising the steps of:
- creating a patch cell for a given cell of the layout, said patch cell including at least some features from higher level cells above the given cell, and further including at least some features from the given cell;
- identifying layout errors in the patch cell;
- adding features to the patch cell to correct one or more of the identified errors;
- removing all but the added features from the patch cell; and then
- instantiating the patch cell into the layout to thereby effectuate the patch cell corrections into the layout.

41. The computer readable encoding of claim 40 wherein the patch cell includes metal and via features from the given cell.

42. The computer readable encoding of claim 40 wherein the added features comprise metal and via features.

43. The computer readable encoding of claim 40 wherein the identifying step comprises identifying isolated vias.

* * * * *